United States Patent
Chu et al.

(10) Patent No.: US 9,079,761 B2
(45) Date of Patent: Jul. 14, 2015

(54) STACKED SEMICONDUCTOR DEVICE AND METHOD OF FORMING THE SAME RELATED CASES

(71) Applicant: Taiwan Semiconductor Manufacturing Company, Ltd., Hsin-Chu (TW)

(72) Inventors: Chia-Hua Chu, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 13/906,080

(22) Filed: May 30, 2013

(65) Prior Publication Data

US 2014/0264474 A1    Sep. 18, 2014

Related U.S. Application Data

(60) Provisional application No. 61/785,104, filed on Mar. 14, 2013.

(51) Int. Cl.

| | |
|---|---|
| *B81C 3/00* | (2006.01) |
| *B81B 7/00* | (2006.01) |
| *H01L 25/00* | (2006.01) |
| *H01L 23/10* | (2006.01) |
| *H01L 23/00* | (2006.01) |

(52) U.S. Cl.
CPC ........... *B81B 7/0041* (2013.01); *B81C 2203/00* (2013.01); *B81C 2203/0714* (2013.01); *H01L 23/10* (2013.01); *H01L 24/27* (2013.01); *H01L 24/29* (2013.01); *H01L 24/32* (2013.01); *H01L 24/83* (2013.01); *H01L 25/50* (2013.01); *H01L 2224/04026* (2013.01); *H01L 2224/2745* (2013.01); *H01L 2224/27452* (2013.01); *H01L 2224/27831* (2013.01); *H01L 2224/291* (2013.01); *H01L 2224/29011* (2013.01); *H01L 2224/29124* (2013.01); *H01L 2224/29147* (2013.01); *H01L 2224/32145* (2013.01); *H01L 2224/8382* (2013.01); *H01L 2224/83805* (2013.01); *H01L 2924/1461* (2013.01)

(58) Field of Classification Search
CPC   B81C 3/001; B81C 2203/00; B81C 2203/01; B81C 2203/0118; B81C 2203/0714; B81C 2203/0728; B81C 2203/0735
See application file for complete search history.

(56) References Cited

U.S. PATENT DOCUMENTS

2012/0313235 A1\*   12/2012   Chu et al. ................ 257/692

\* cited by examiner

*Primary Examiner* — Jae Lee
(74) *Attorney, Agent, or Firm* — Slater & Matsil, L.L.P.

(57) ABSTRACT

A stacked semiconductor device includes a CMOS device and a MEMS device. The CMOS device includes a multilayer interconnect with metal elements disposed over the multilayer interconnect. The MEMS device includes metal sections with a first dielectric layer disposed over the metal sections. A cavity in the first dielectric layer exposes portions of the metal sections. A dielectric stop layer is disposed at least over the interior surface of the cavity. A movable structure is disposed over a front surface of the first dielectric layer and suspending over the cavity. The movable structure includes a second dielectric layer over the front surface of the first dielectric layer and suspending over the cavity, metal features over the second dielectric layer, and a flexible dielectric membrane over the metal features. The CMOS device is bonded to the MEMS device with the metal elements toward the flexible dielectric membrane.

20 Claims, 12 Drawing Sheets

STACKED SEMICONDUCTOR DEVICE AND METHOD OF FORMING THE SAME

RELATED CASES

RELATED CASES

This application claims priority to U.S. Provisional Patent Application No. 61/785,104, filed Mar. 14, 2013 and entitled, "Stacked Semiconductor Device and Method of Forming the Same," which application is incorporated herein by reference.

TECHNICAL FIELD

This disclosure relates generally to a stacked semiconductor device and, more particularly, to a stacked semiconductor device including a micro-electro-mechanical system (MEMS) device and a complementary metal-oxide-semiconductor (CMOS) device and methods for forming the stacked semiconductor device.

BACKGROUND

A micro-electro-mechanical system (MEMS) device is a piece of technology with components on a very small scale. MEMS devices may have components within the micrometer size range and sometimes within the nanometer size range. A typical MEMS device may include processing circuitry as well as mechanical components for various types of sensors. MEMS applications include inertial sensors applications, such as motion sensors, accelerometers, and gyroscopes. Other MEMS applications include optical applications such as movable mirrors, RF applications such as RF switches and resonators, and biological sensing structures.

A demand for smaller ICs with higher performance has led to the development of stacked devices, where one of the stacked devices is dedicated to MEMS applications and other of the stacked devices is dedicated to logic or other types of CMOS circuitry. However, it can be difficult to manufacture a stacked semiconductor device with multiple types of function, due to integration problems of the different circuit fabrication technologies. Various techniques directed at configurations and fabrication methods of these stacked semiconductor devices including a MEMS device and a CMOS device have been implemented to try and further improve these integrated semiconductor devices' performances.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2M are cross-sectional views of a MEMS device in a stacked semiconductor device at various stages of manufacture according to one or more embodiments of this disclosure.

FIGS. 3A to 3C are cross-sectional views of a CMOS device in a stacked semiconductor device at various stages of manufacture according to one or more embodiments of this disclosure.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure. Further still, references to relative terms such as "top," "front," "bottom," and "back" are used to provide a relative relationship between elements and are not intended to imply any absolute direction. Various features may be arbitrarily drawn in different scales for simplicity and clarity.

According to one or more embodiments of this disclosure, a stacked semiconductor device including a micro-electro-mechanical system (MEMS) device bonded to a complementary metal-oxide-semiconductor (CMOS) device. The MEMS device includes a motion sensor (for example, a gyroscope or an accelerometer), a RF MEMS device (for example, a RF switch, resonator, or filter), a MEMS magnetometer, an optical MEMS device (for example, a MEMS micro-mirror), a MEMS oscillator, a MEMs microphone, and/or any other MEMS type device. The CMOS device includes a logic device, memory device (for example, a static random access memory (SRAM), radio frequency (RF) device, input/output (I/O) device, system-on-chip (SoC), other suitable type of device, or combinations thereof.

Figure 1:
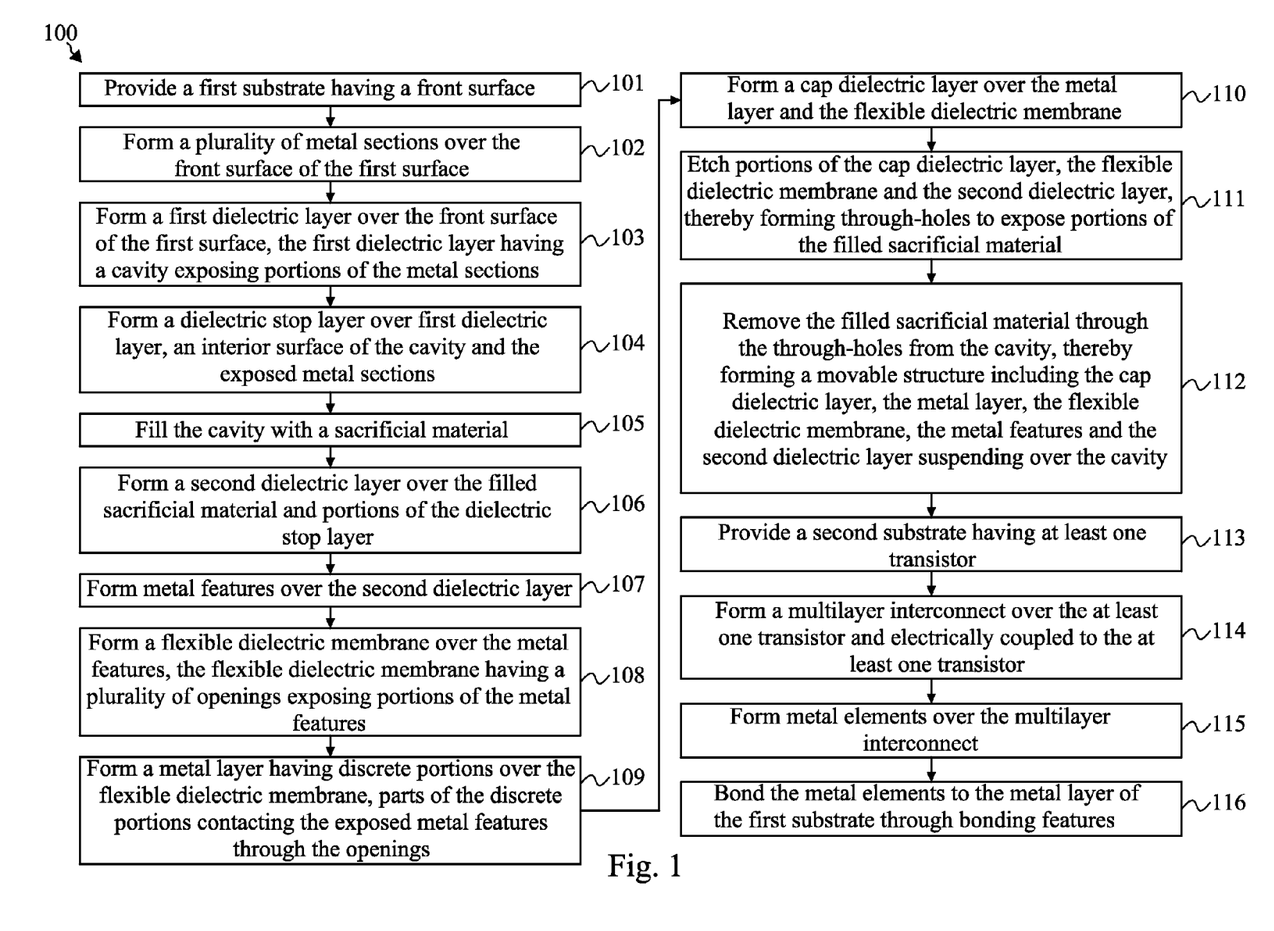
FIG. 1 is a flowchart of a method of forming a stacked semiconductor device including a MEMS device and a CMOS device according to at least one embodiment of this disclosure.

FIG. 1 is a flowchart of a method 100 of forming a stacked semiconductor device including a MEMS device bonded a CMOS device according to at least one embodiment of this disclosure. Additional processes may be provided before, during, or after the method 100 of FIG. 1.

Referring now to FIG. 1, the operations 101-112 in the method 100 are for the MEMS device in the stacked semiconductor device. The operations 113-115 in the method 100 are for the CMOS device in the stacked semiconductor device. The operation 116 in the method 100 is for the MEMS device bonded to the CMOS device to form the stacked semiconductor device. The flowchart of the method 100 begins with operation 101. At operation 101, a first substrate having a front surface is provided. Next, the method 100 continues with operation 102 in which a plurality of metal sections are formed over the front surface of the first substrate. At operation 103, a first dielectric layer is formed over the front surface of the first substrate. The first dielectric layer has a cavity exposing portions of the metal sections. At operation 104, a dielectric stop layer is formed over first dielectric layer, an interior surface of the cavity and the exposed metal sections. At operation 105, the cavity is filled with a sacrificial material. At operation 106, a second dielectric layer is formed over the filled sacrificial material and portions of the dielectric stop layer. At operation 107, metal features are formed over the second dielectric layer. At operation 108, a flexible dielectric membrane is formed over the second dielectric layer. The flexible dielectric membrane has a plurality of openings exposing portions of the metal features. At operation 109, a metal layer having discrete portions is formed over the flexible dielectric membrane. Parts of the discrete portions of the metal layer contact the exposed metal features through the opening in the flexible dielectric membrane. At operation 110, a cap dielectric layer is formed over the metal layer and the flexible dielectric membrane. At operation 111, portions of the cap dielectric layer, the flexible dielectric membrane and the second dielectric layer are etched. Thereby through-holes are formed to expose portions of the filled sacrificial material. At operation 112, the filled sacrificial material is removed through the through-holes from the cavity. Thereby a movable structure including the cap dielectric layer, the metal layer, the flexible dielectric membrane, the metal features and the second dielectric layer is formed. The movable structure suspends over the cavity. At operation 113, a second substrate having at least one transistor is provided. At operation 114, a multilayer interconnect is formed over the at least one transistor and electrically coupled to the at least one transistor. At operation 115, metal elements are formed over the multilayer interconnect. At operation 116, the metal elements are bonded to the metal layer of the first substrate through bonding features between the metal elements and the metal layer.

FIGS. 2A-2M, 3A-3C, and 4A-4B are cross-sectional views of a stacked semiconductor device 400 including a MEMS device 200 and a CMOS device 300 at various stages of manufacture according to various embodiments of the method 100 of FIG. 1. FIGS. 2A to 2M are cross-sectional views of the MEMS device 200 in the stacked semiconductor device 400 at various stages of manufacture.

Figure 2A:
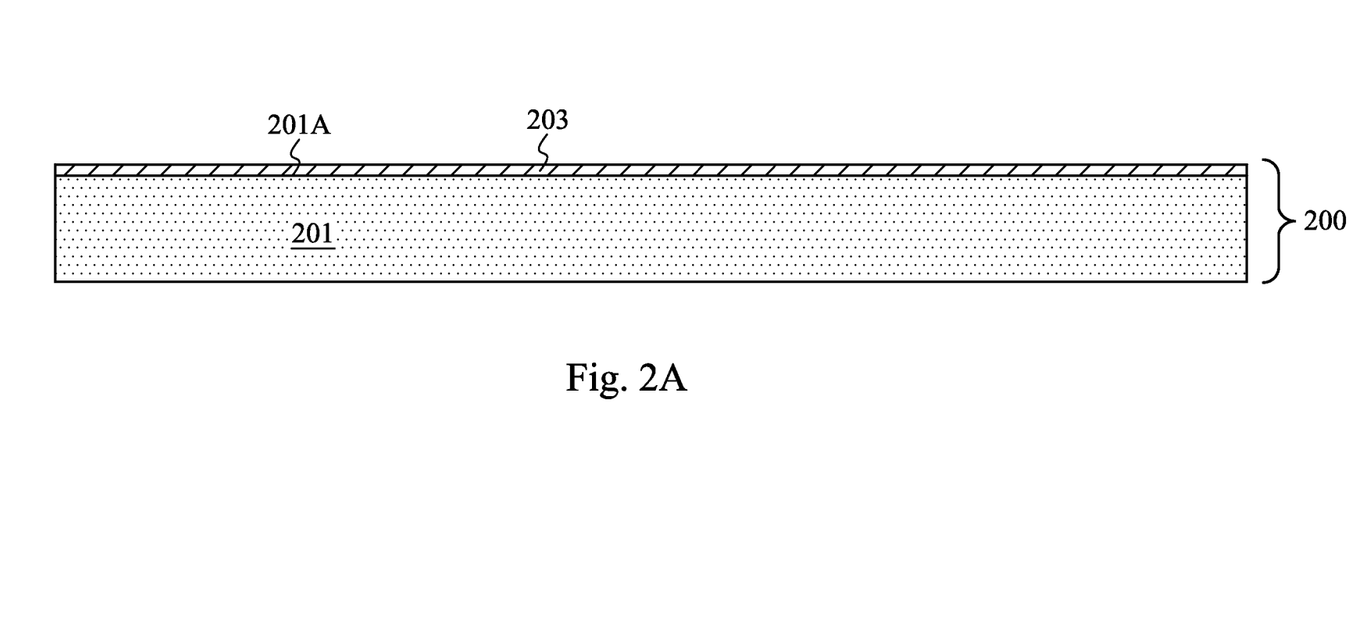

Referring to FIG. 2A, which is an enlarged cross-sectional view of a portion of a substrate 201 (also referred to as MEMS substrate 201) of the MEMS device 200 after performing operation 101. In some embodiments, the substrate 201 includes a plurality of MEMS chips marked on the substrate 201, which is in a wafer form. The plurality of MEMS chips are divided by scribe lines between the MEMS chips on the wafer. According to one or more embodiments of this disclosure, at least one MEMS device 200 is formed within a chip region of the MEMS substrate 201. The MEMS substrate 201 will go through a variety of cleaning, depositing, patterning, etching, releasing and doping steps to form the at least one MEMS device as mentioned in the previous text. The term "substrate" herein generally refers to a bulk substrate on which various layers and MEMS structures are formed. In the embodiments in FIGS. 2A-2M, the MEMS device 200 is referred to a RF MEMS switch device. The RF MEMS switch device includes a flexible electrode of a micro-machined capacitor. With the up- and down-state of the flexible electrode of the capacitor, the capacitance of the RF MEMS switch device is variable as a switch to control the transmission of a RF signal.

Figure 2B:
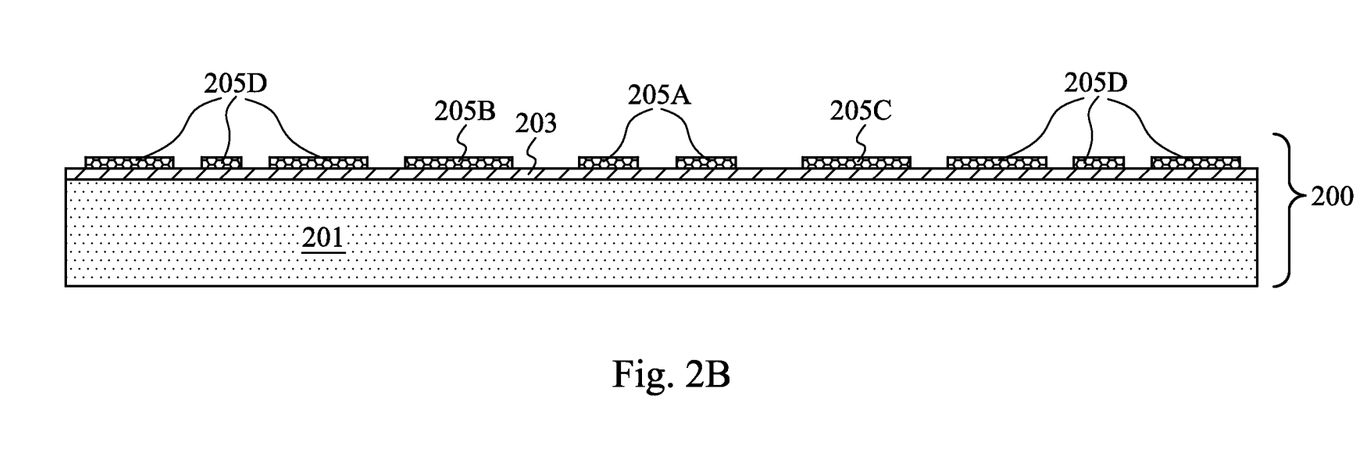

Referring to FIG. 2A, the MEMS substrate 201 is referred to a high resistive silicon substrate. The high resistive silicon substrate has a resistance of at least 1000 ohms-cm. In some examples, the MEMS substrate 201 includes glass, quartz or GaAs to prevent signal loss through the substrate 201 for RF application. The MEMS substrate 201 has front surface 201A. The MEMS device 200 further includes an isolation layer 203 formed on the front surface 201A. The isolation layer 203 may electrically isolate the MEMS substrate 201 and components formed overlying the isolation layer 203. The isolation layer 203 may include silicon oxide, silicon nitride, silicon oxynitride, TEOS oxide, low-k dielectric material, or combinations thereof FIG. 2B is a cross-sectional view of the MEMS device 200 after performing operation 102. A metal layer is formed using various deposition processes, lithography patterning processes, etching processes or combination thereof to form metal sections 205A to 205D on the isolation layer 203. In some examples, the metal layer includes aluminum, copper, aluminum/copper alloy, titanium, tantalum, tungsten, metal silicide, or combinations thereof. In certain examples, the metal layer has a thickness in a range from about 3000 angstrom to about 7000 angstrom.

The metal sections 205A-C are referred to as a first electrode in the MEMS device 200. The metal sections 205A are configured to transmit a signal of the MEMS device 200. The metal sections 205A are referred to as signal elements of the first electrode. The metal sections 205B and 205C configured to connect a power source from the MEMS device 200 are pull-down elements of the first electrode. The metal sections 205A are adjacent to the metal sections 205B-C and are separated from the metal sections 205B and 205C by gaps. The metal sections 205D may electrically connect to the metal sections 205A-C and act as electrical contacts to upper metal layers.

Figure 2C:
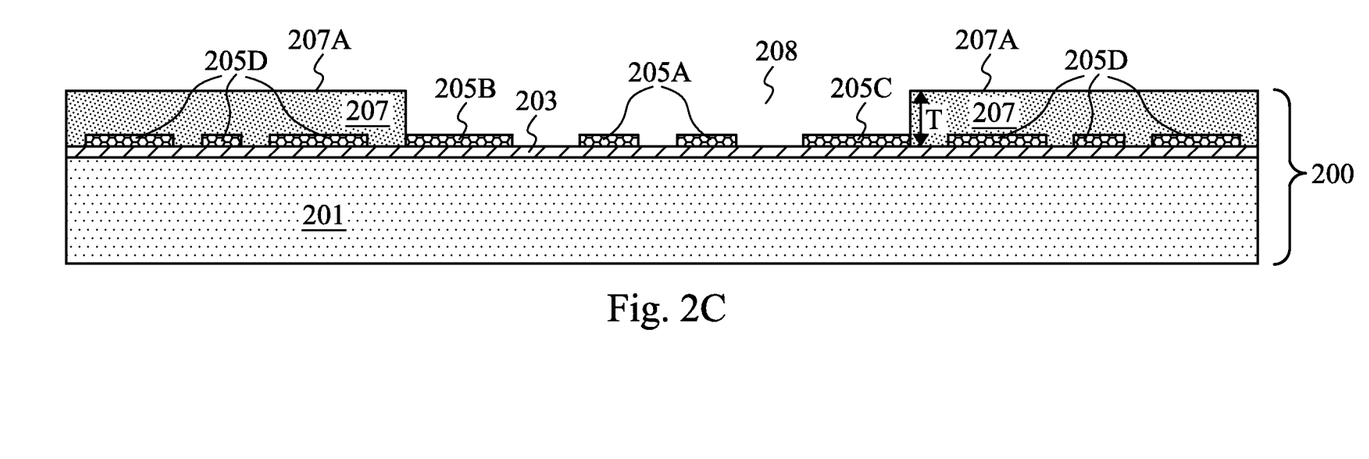

FIG. 2C is a cross-sectional view of the MEMS device 200 after performing operation 103. A first dielectric layer 207 is formed over the metal sections 205A-D and the isolation layer 203. The first dielectric layer 207 has a front surface 207A. The first dielectric layer 207 may include silicon oxide, silicon nitride, silicon oxynitride, TEOS oxide, low-k dielectric material, or combinations thereof. The formation method of the first dielectric layer 207 includes chemical vapor deposition (CVD), low pressure CVD (LPCVD), plasma enhanced CVD (PECVD), or other suitable methods. The first dielectric layer 207 has a thickness T at least larger than 0.5 micrometer to about 2 micrometer. A cavity 208 is formed in the first dielectric layer 207. In some examples, a dry etching process or a wet etching process is performed to etch a portion of the first dielectric layer 207 to form the cavity 208. The cavity 208 has an interior surface including a bottom surface and a sidewall surface. Portions of metal sections 205A-D are exposed through the cavity 208. In FIG. 2C, signal elements of the first electrode (205A) and pull-down elements of the first electrode (205B-C) are exposed. The cavity 202 has a depth substantially equal to the thickness T of first dielectric layer 207. The depth is at least larger than 0.5 micrometer to ensure the motion of the later formed flexible second electrode.

Figure 2D:
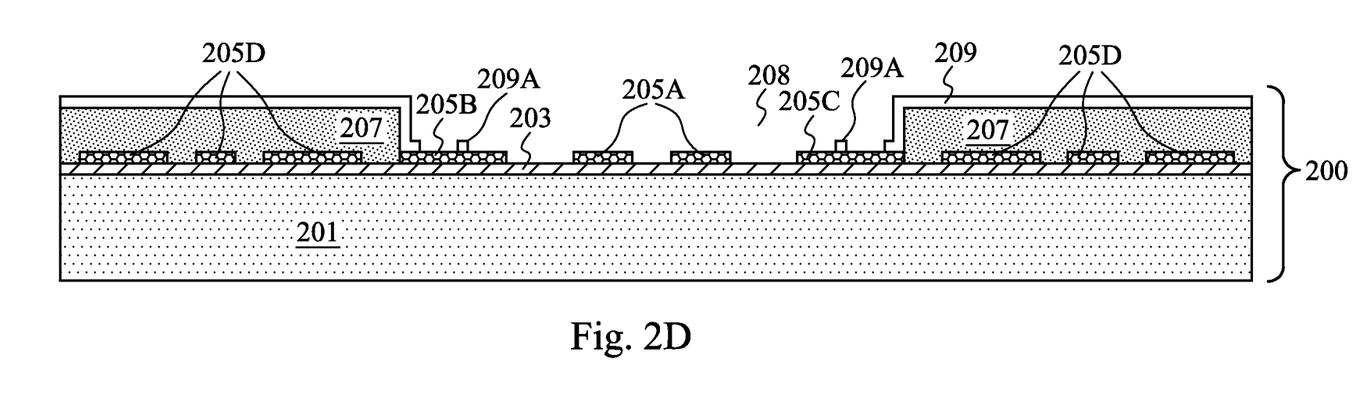

Referring to FIG. 2D, the MEMS device 200 further includes a bump dielectric layer 209 formed over the structure shown in FIG. 2C. The bump dielectric layer 209 includes silicon oxide, silicon nitride, silicon oxynitride, TEOS oxide, low-k dielectric material, or combinations thereof. Portions of the bump dielectric layer 209 are removed to form insulating bumps 209A on the metal sections 205BC (pull-down elements of the first electrode).

Figure 2E:
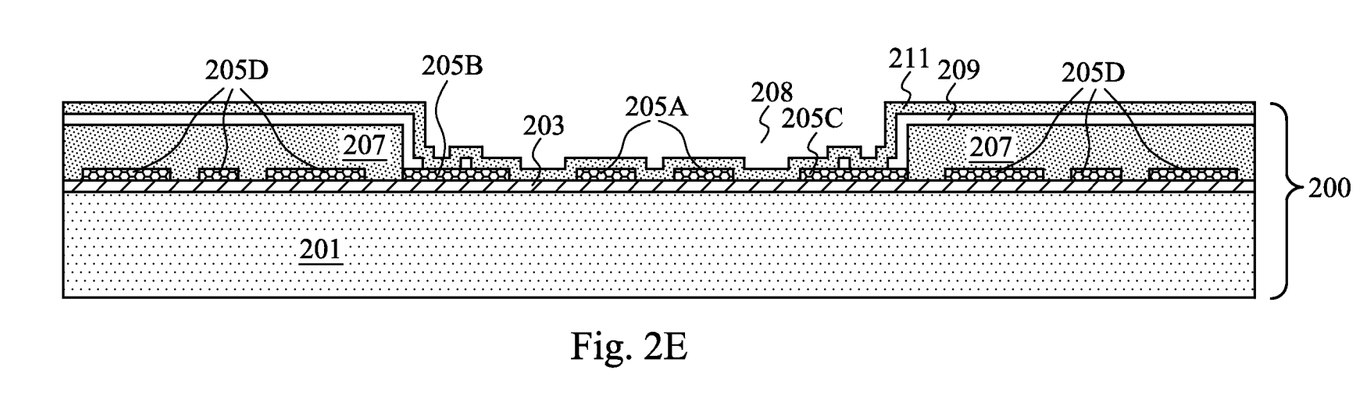

FIG. 2E is a cross-sectional view of the MEMS device 200 after performing operation 104. A dielectric stop layer 211 is formed on the interior surface of the cavity 208, the exposed metal sections 205A-C, the insulating bumps 209A and the remaining bump dielectric layer 209. The dielectric stop layer 211 includes silicon oxide, silicon nitride, silicon oxynitride, TEOS oxide, low-k dielectric material, or combinations thereof. The dielectric stop layer 211 has higher etching or polishing resistance compared to the following formed sacrificial material. In one example, the dielectric stop layer 211 may be a conformal liner along the interior surface of the cavity 208. The dielectric stop layer 211 has a thickness less than the depth of the cavity 208. The formation method of the dielectric stop layer 211 includes chemical vapor deposition (CVD), low pressure CVD (LPCVD), atmospheric pressure CVD (APCVD), plasma enhanced CVD (PECVD) or combinations thereof.

Figure 2F:
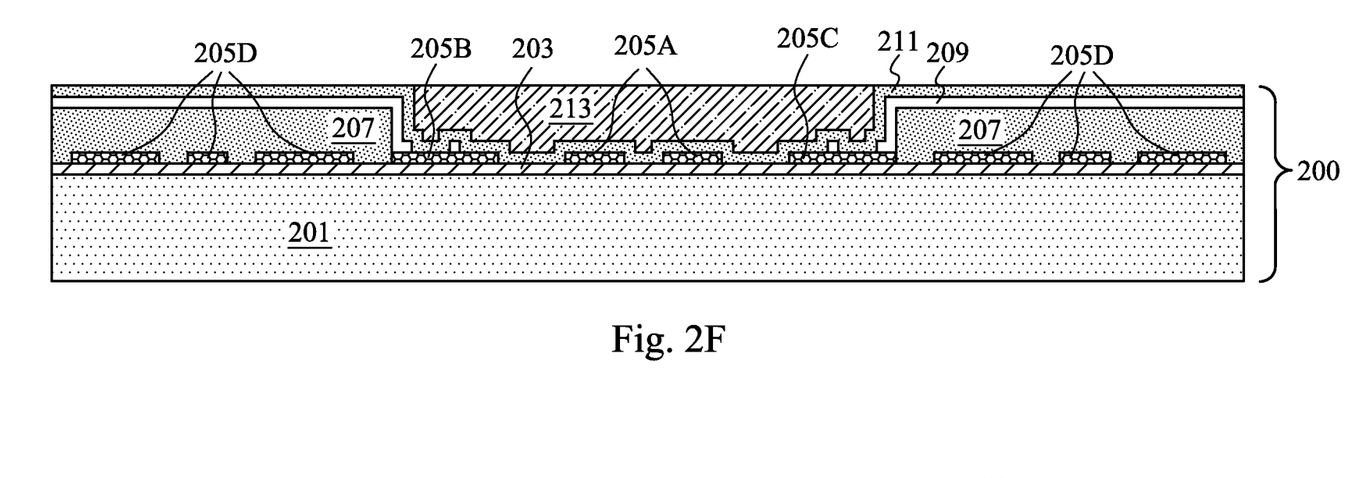

FIG. 2F is a cross-sectional view of the MEMS device 200 after performing operation 105. A sacrificial material 213 is overfilled the cavity 208 to a level above a top surface of the dielectric stop layer 211. In at least one example, the sacrificial material 213 includes polycrystalline silicon, amorphous silicon or other suitable materials which have less etching or polishing resistance compared to the dielectric stop layer 211 formed in operation 104. The sacrificial material 213 may be formed by CVD, PECVD or low pressure chemical vapor deposition (LPCVD). A planarization operation, such as chemical mechanical polishing (CMP) process and/or etching process, is applied to the sacrificial material 213 to reduce the thickness of the sacrificial material 213 to expose a portion of the dielectric stop layer 211. The planarization operation could cease as the top surface of the dielectric stop layer 211 is exposed. In one example, a removed rate ratio of the sacrificial material 213 to the dielectric stop layer 211 is larger than about 10 during the planarization operation. In at least one embodiment, a top surface of the planarized sacrificial material 213 is substantially planar to the top surface of the dielectric stop layer 211.

Figure 2G:
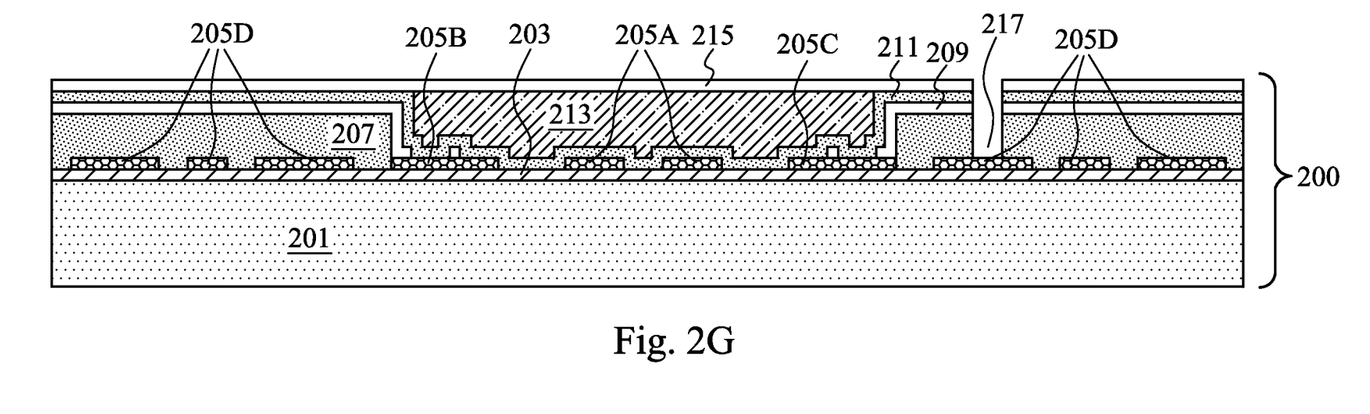

FIG. 2G is a cross-sectional view of the MEMS device 200 after performing operation 106. A second dielectric layer 215 is formed on the filled sacrificial material 213 and the dielectric stop layer 211 over the front surface 201A of the MEMS substrate 201. The second dielectric layer 215 has a higher etching resistance than the sacrificial material 213 in a following etching process to release the second dielectric layer 215 from the top surface of the sacrificial material 213. The details will be described in later text. In some examples, the second dielectric layer 215 includes silicon oxide, silicon nitride or silicon oxy-nitride. In certain examples, the second dielectric layer 215 has a thickness in a range from about 500 angstrom to about 1200 angstrom. The formation method of the second dielectric layer 215 includes chemical vapor deposition (CVD), low pressure CVD (LPCVD), atmospheric pressure CVD (APCVD), plasma enhanced CVD (PECVD), thermal oxidation or combinations thereof.

Vias 217 are formed in the second dielectric layer 215, the dielectric stop layer 211, bump dielectric layer 209 and the first dielectric layer 207 by lithography patterning processes and etching processes to expose portions of metal sections 205A-D. In FIG. 2G, only one via is shown for illustration purpose.

Figure 2H:
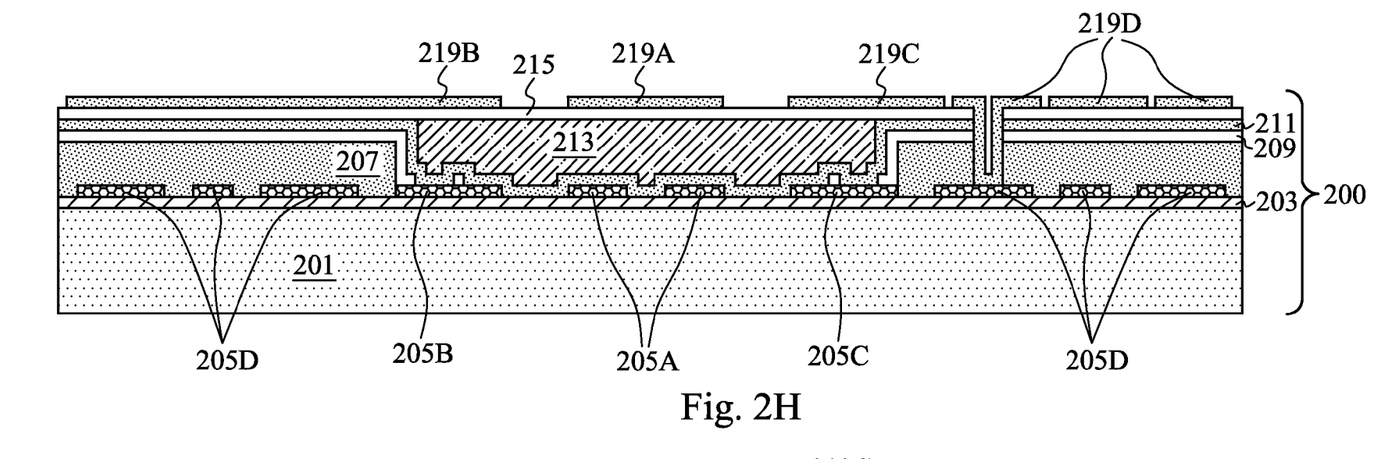

FIG. 2H is a cross-sectional view of the MEMS device 200 after performing operation 107. A metal layer is formed using various deposition processes, lithography patterning processes and etching processes to form metal features 219A-D on the second dielectric layer 215. In some examples, the metal layer includes aluminum, copper, aluminum/copper alloy, titanium, tantalum, tungsten, metal silicide, or combinations thereof. In certain examples, the metal layer has a thickness in a range from about 3000 angstrom to about 7000 angstrom.

In the depicted embodiment, the metal features 219A-C are referred to as a second electrode in the MEMS device 200. Corresponding to the signal element of the first electrode (the metal section 205A) in the MEMS device 200, the metal feature 219A in the MEMS device 200 is referred to as a signal element of the second electrode which is configured to transmit a signal cooperating with the first electrode (the metal section 205A) of the MEMS device 200. Corresponding to the pull-down elements of the first electrode (the metal sections 205B and 205C) in the MEMS device 200, the metal features 219BC are pull-down elements of the second electrode which are configured to connect a power source from the MEMS device 300. The metal feature 219A is adjacent to the metal features 219B and 219C. The metal feature 219A separated from the metal features 219B and 219C by gaps. The metal features 219D are configured to connect the metal sections 205D through vias 217 and also connect to upper metal layers formed in the following processes.

Figure 2I:
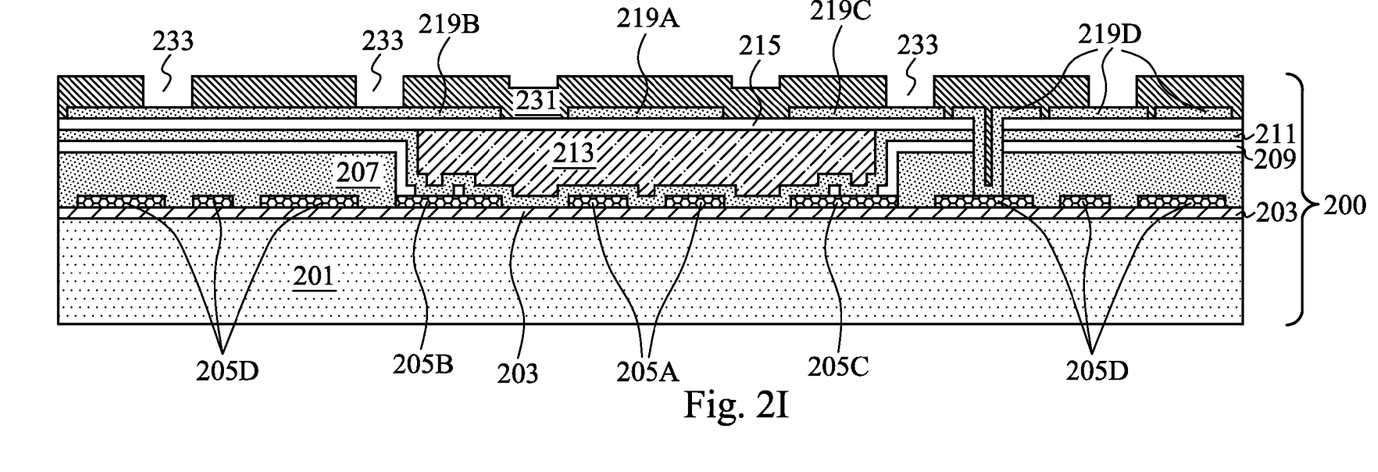

FIG. 2I is a cross-sectional view of the MEMS device 200 after performing operation 108. A flexible dielectric membrane 231 is formed over the metal features 219A-D and the second dielectric layer 215. The flexible dielectric membrane 231 provides mechanical strength and rigidity to act as a flexible suspended membrane or beam for a movable structure in the MEMS device 200. In certain examples, the flexible dielectric membrane 231 has a thickness in a range from about 0.5 micrometer to about 5 micrometer. The dielectric membrane 207 may include silicon oxide, silicon nitride, silicon oxy-nitride or any suitable materials. The formation method of the dielectric membrane 207 includes CVD, low pressure CVD (LPCVD), atmospheric pressure CVD (APCVD), plasma enhanced CVD (PECVD), or combinations thereof.

After the formation of the flexible dielectric membrane 231, openings 233 are formed in the flexible dielectric membrane 231 to expose portions of the metal features 219A-D. The openings 233 are formed using various lithography patterning processes, etching processes including dry etching or wet etching.

Figure 2J:
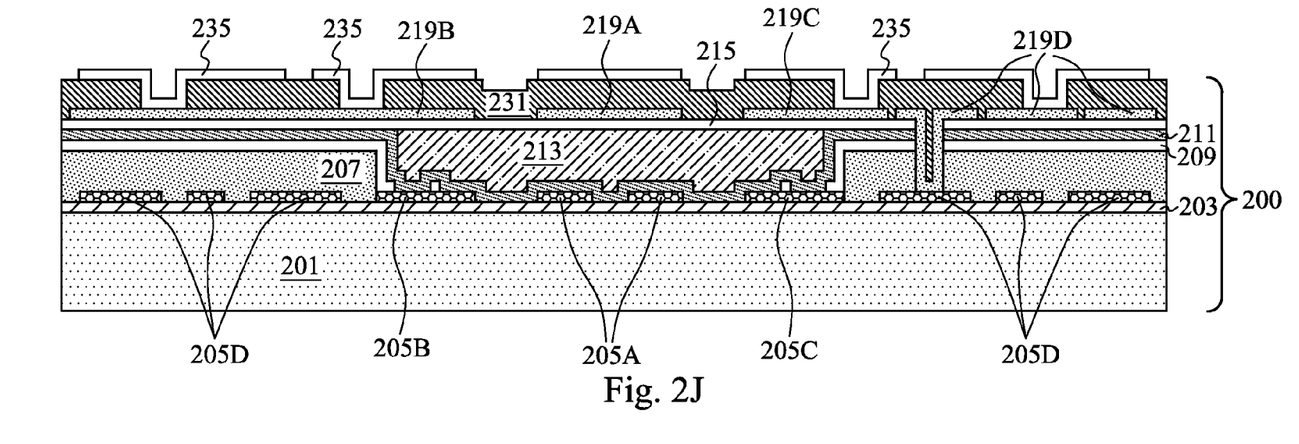

FIG. 2J is a cross-sectional view of the MEMS device 200 after performing operation 109. A metal layer is conformally formed on the flexible dielectric membrane 231, along interior surface of the openings 233 and on the exposed portion of the metal feature 219A-D. The metal layer is patterned using various lithography patterning processes, etching processes or combination thereof to form discrete portions 235 over the flexible dielectric membrane 231. Parts of the discrete portions 235 of the metal layer contact the exposed metal features 219 through the openings 233. The metal layer 235 may electrically connect to the metal sections 205A-D in the first electrode or the metal features 219A-D in the second electrode, and transfer the electrical signals to upper metal layers. In some examples, the discrete portions 235 of the metal layer include aluminum, copper, aluminum/copper alloy, titanium, tantalum, tungsten, metal silicide, or combinations thereof. In certain examples, the metal layer 235 has a thickness in a range from about 3000 angstrom to about 7000 angstrom.

Figure 2K:
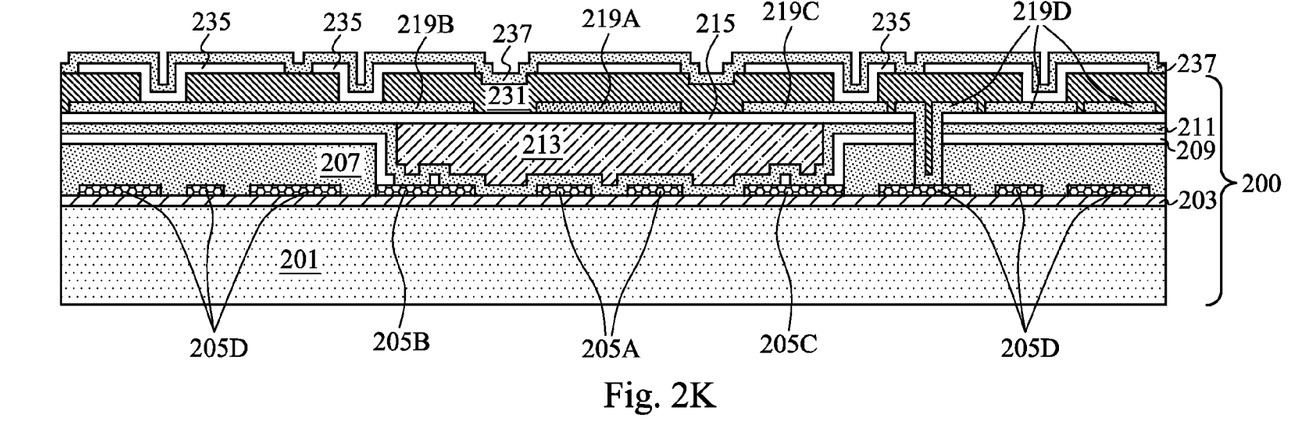

FIG. 2K is a cross-sectional view of the MEMS device 200 after performing operation 110. A cap dielectric layer 237 is conformally formed over the discrete portions 235 of the metal layer and on the exposed flexible dielectric membrane 231. The cap dielectric layer 237 may include silicon oxide, silicon nitride, silicon oxy-nitride or any suitable materials. In certain examples, the cap dielectric layer 237 has a thickness in a range from about 500 angstrom to about 1200 angstrom. The formation method of the cap dielectric layer 237 includes chemical vapor deposition (CVD), low pressure CVD (LPCVD), atmospheric pressure CVD (APCVD), plasma enhanced CVD (PECVD), or combinations thereof. The cap dielectric layer 237 may protect the underlying metal layer 235 from damage in the following processes, such as the sacrificial material 213 removal.

Figure 2L:
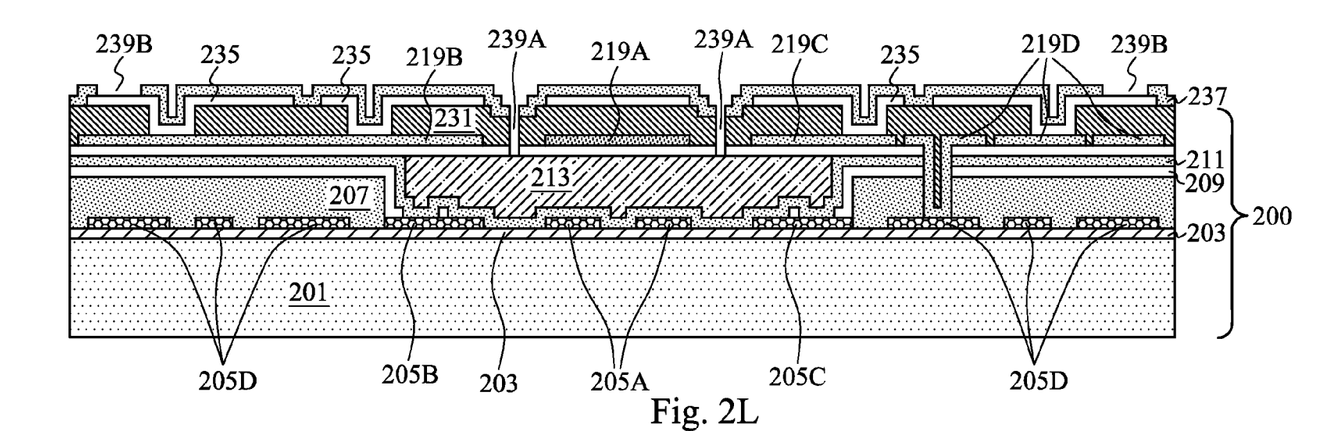

FIG. 2L is a cross-sectional view of the MEMS device 200 after performing operation 111. Through-holes 239A are formed in the MEMS device 200 shown in FIG. 2K. The through-holes 239A extend through the cap dielectric layer 237, the flexible dielectric membrane 231, the second dielectric layer 215 and exposes portions of the sacrificial material 213. The through-holes 239A are formed using various lithography patterning processes, etching processes including dry etching or wet etching. In some examples, the through-holes 239A are formed in a dry etching process in an ambience including fluorine. A plurality of apertures 239B is formed in the cap dielectric layer 237 to expose portions of the metal layer 235. The apertures 239B are configured to form electrical structures on the metal layer 235 to connect an external power source to the MEMS device 200. The apertures 239B may be formed in a same etching process to form the through-holes 239A or a different etching process to form the through-holes 239A.

Figure 2M:
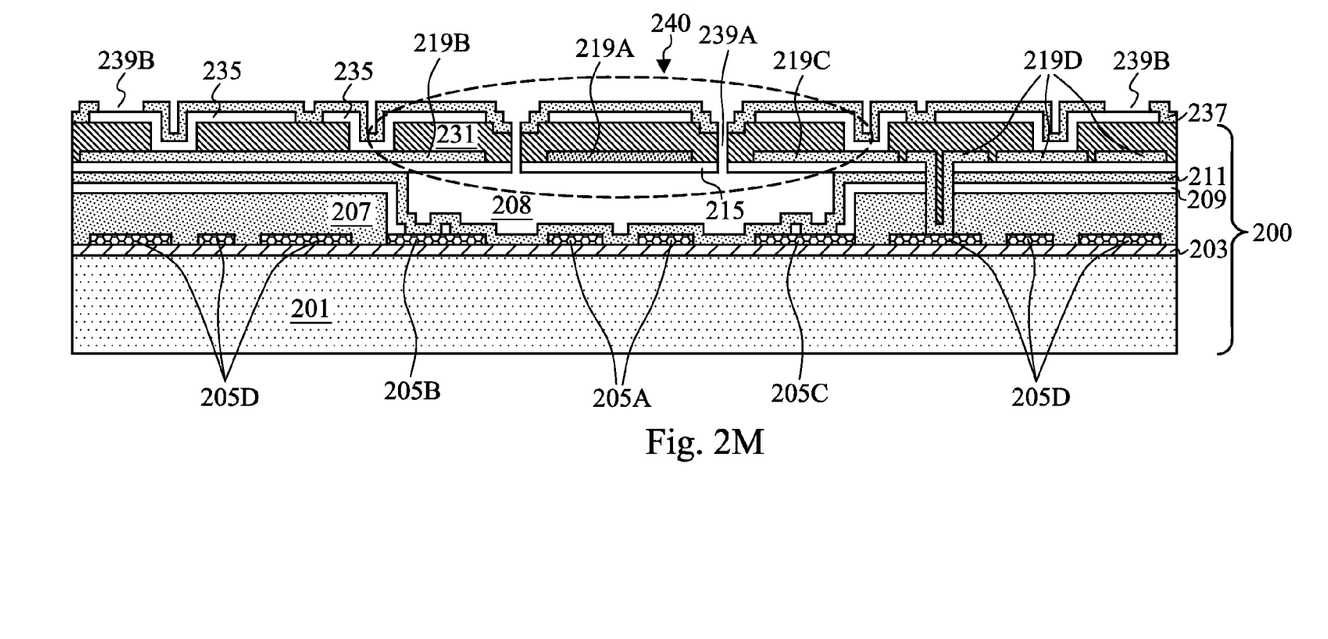

FIG. 2M is a cross-sectional view of the MEMS device 200 after performing operation 112. In some examples, a dry etching process in an ambience including fluorine is performed through the through-holes 239A to isotropically etch the filled sacrificial material 213 in the cavity 208. The cavity 208 appears under the flexible dielectric membrane 231 in the MEMS substrate 201 after the sacrificial material 213 removal. The cap dielectric layer 237, the flexible dielectric membrane 231 and the second dielectric layer 215 have a higher etching resistance than the sacrificial material 213 in the etching process to remove the sacrificial material 213. An etching selectivity of the sacrificial material 213 to the cap dielectric layer 237, the flexible dielectric membrane 231 or the second dielectric layer 215 is larger than about 20. Also, the dielectric stop layer 211 has a higher etching resistance than the sacrificial material 213 in the etching process to remove the sacrificial material 213 and protect the MEMS substrate 201 from damage.

After the formation of the cavity 208, a movable structure 240 is released from the MEMS substrate 201 and suspends over the cavity 208. The movable structure 240 includes the flexible dielectric membrane 231 sandwiched by a movable second electrode (metal features 219A-C) and the metal layer 235. The movable structure 240 further includes the cap dielectric layer 237 and the second dielectric layer 215 on top and bottoms surfaces of the movable structure 240, respectively.

In embodiments in FIGS. 2A-2M, the movable structure 240 is a symmetrical structure with a metal layer (for example, the metal features 219A-C or the metal layer 235) and a dielectric layer (for example, the second dielectric layer 215 or the cap dielectric layer 237) disposed on each side of the flexible dielectric membrane 231. The metal layer 235 and the cap dielectric layer 237, which are over the top surface of the flexible dielectric membrane 231, may balance the stress from the metal features 219A-C and the second dielectric layer 215, which are over the bottom surface of the flexible dielectric membrane 231. Due to the stress balance in each side, the movable structure 240 may not bend upward or downward. In certain embodiments, the movable structure 240 is an asymmetrical structure with a metal layer (for example, the metal features 219A-C) and a dielectric layer (for example, the second dielectric layer 215) disposed only over the bottom surface of the flexible dielectric membrane 231.

The flexible dielectric membrane 231 provides mechanical strength and rigidity to act as a suspended membrane or beam for the movable structure 240 in the MEMS device 200. In some examples, a ratio of the thickness of the flexible dielectric membrane 231 to the thickness of the metal features 219A-D (and the thickness of the metal layer 235) is in a range from about 2 to about 7. In certain examples, a ratio of the thickness of the flexible dielectric membrane 231 to the thickness of the second dielectric layer 215 (and the thickness of the cap dielectric layer 237) is in a range from about 5 to about 70.

Figure 3A:
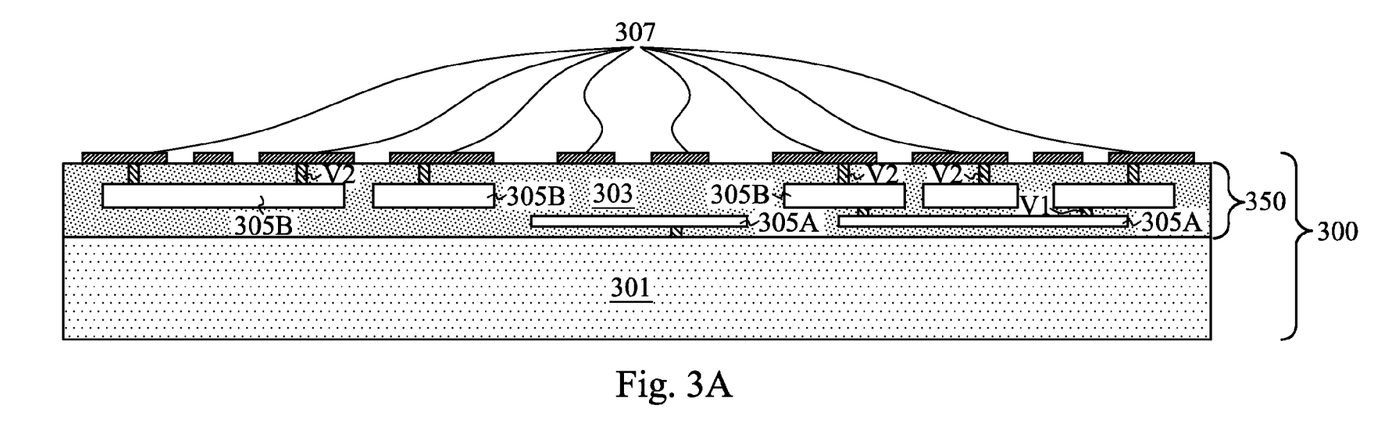
Figure 3B:
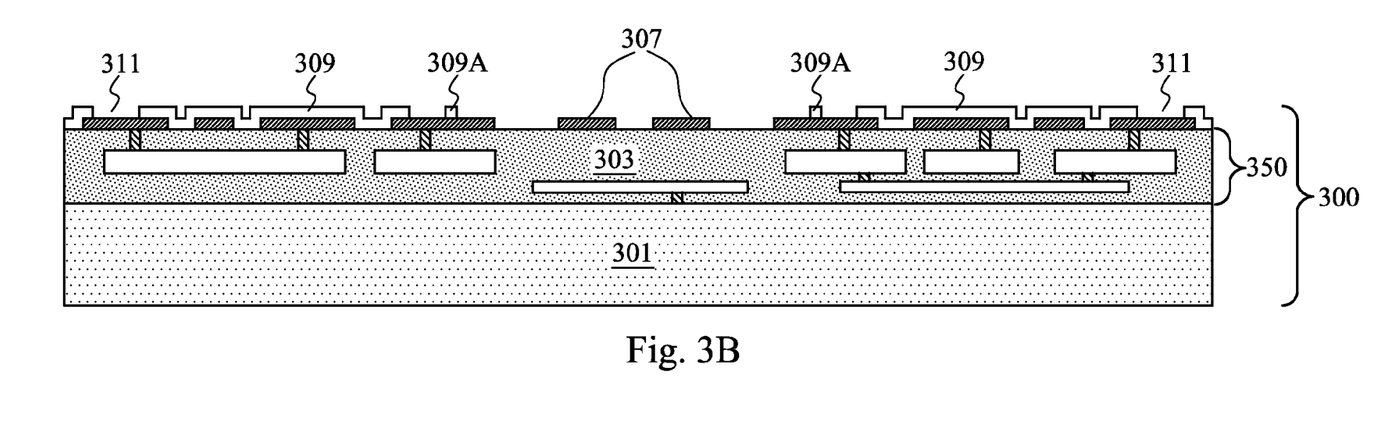
Figure 3C:
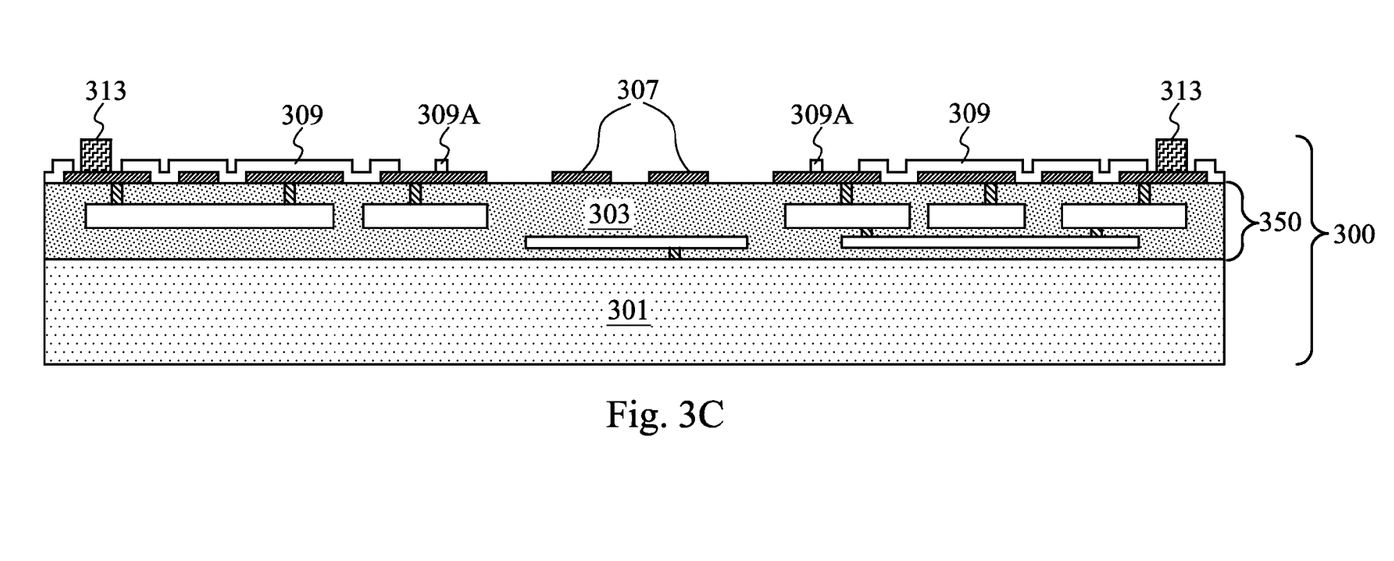

FIGS. 3A to 3C are cross-sectional views of the CMOS device 300 in the stacked semiconductor device 400 at various stages of manufacture according to various embodiments to form the stacked semiconductor device 400. Additional processes may be provided before, during, or after the manufacture stages in FIGS. 3A to 3C. Various figures have been simplified for a better understanding of the inventive concepts of the present disclosure.

Similar to the MEMS device 200, at least one the CMOS device 300 is formed within a chip region of a CMOS substrate. A plurality of CMOS chips are divided by scribe lines between the COMS chips in the CMOS substrate in a wafer form. The CMOS substrate will go through a variety of cleaning, depositing, patterning, etching, and doping steps to form the at least one CMOS device within a chip region. The CMOS device includes a logic device, memory device (for example, a static random access memory (SRAM), radio frequency (RF) device, input/output (I/O) device, system-on-chip (SoC), other suitable type of device, or combinations thereof. Various device structures may be formed in the CMOS device including transistors, resistors, and/or capacitors, which may be connected through an interconnect layer to additional integrated circuits.

FIG. 3A is a cross-sectional view of the CMOS device 300 after performing operations 113-115. Referring to FIG. 3A, which is an enlarged cross-sectional view of a portion of the CMOS device 300. The CMOS device 300 includes a substrate 301 (also referred to as CMOS substrate 301). In the depicted embodiment, the CMOS substrate 301 is a semiconductor substrate including silicon. Alternatively or additionally, the CMOS substrate 301 includes another semiconductor, such as germanium silicon carbide, gallium arsenic, gallium phosphide, indium phosphide, indium arsenide, or a semiconductor on insulator (SOI). The CMOS device 300 may further include various device structures (not shown) over the CMOS substrate 301. Various device structures may include transistors, resistors, and/or capacitors.

A multilayer interconnect (MLI) 350 is formed over a front surface of the CMOS substrate 301. The MLI 350 is coupled to various device structures or components of the CMOS device 300. The MLI 350 includes various conductive features, which may be vertical interconnects in different levels, such vias V1 and V2, and horizontal interconnects in different levels, such as lines 305A and 305B. The various conductive features in MLI 350 include aluminum, copper, aluminum/silicon/copper alloy, titanium, titanium nitride, tungsten, polysilicon, metal silicide, or combinations thereof. The conductive features in MLI 350 are formed by suitable process, including deposition, lithography patterning, and etching processes to form vertical and horizontal interconnects.

The various conductive features of the MLI 350 are disposed within an intermetal dielectric (IMD) layer 303. In some examples, The IMD layer 303 may have a multilayer structure. The IMD layer 303 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The formation process for IMD layer 303 includes chemical vapor deposition (CVD), PECVD, LPCVD, APCVD, other deposition methods, or combinations thereof.

Still referring to FIG. 3A, the CMOS device 300 further includes a plurality of metal elements 307 formed over the IMD layer 303 and coupled to the MLI 350. The metal elements 307 are formed by suitable process, including deposition, lithography patterning, and etching processes. The metal elements 307 include conductive materials, such as aluminum, aluminum/silicon/copper alloy, titanium, titanium nitride, tungsten, metal silicide, or combinations thereof.

Referring to FIG. 3B, the CMOS device 300 further includes a bump dielectric layer 309 formed on the metal elements 307 and the exposed IMD layer 303 of the CMOS device 300. The bump dielectric layer 309 includes silicon dioxide, silicon nitride, silicon oxynitride, TEOS oxide, PSG, BPSG, FSG, carbon doped silicon oxide, low-k dielectric material, or combinations thereof. Portions of the bump dielectric layer 309 are removed to form insulating bumps 309A on portions of the metal elements 307. Remaining portions of the bump dielectric layer 309 cover the metal elements 307 and expose a portion of the metal elements 307 through holes 311. The insulating bumps 309A may prevent the movable structure 240 of the MEMS device 200 to touch the metal elements 307 of the CMOS device 300 during a moving operation of the stacked device 400. The insulating bumps 309A may also provide a counterforce on the movable structure 240 in the MEMS device 200 to prevent sticking on the metal elements 307 in the CMOS device 300 if there is a residual electrostatic force between the movable structure 240 and the metal elements 307.

Referring to FIG. 3C, bonding features 313 are formed in the holes 311 and contacting the metal elements 307. The bonding features 313 are configured to provide an electrical path from an external power source to various device structures including transistors, resistors, and/or capacitors in the CMOS device 300 through the metal elements 307 and the MLI 350. The bonding features 313 include a conductive material, such as a metal material or a semiconductor material. The metal material of the bonding features includes aluminum, copper or aluminum/copper alloy. The semiconductor material of the bonding features includes silicon or germanium. The bonding features 313 are formed by depositing a conductive layer on the bump dielectric layer 309 and overfilling the holes 311, and then patterning the conductive layer depending on design requirements of the MEMS device 300. The deposition process of the conductive layer includes chemical vapor deposition (CVD), physical vapor deposition (PVD), or other deposition methods. The conductive layer is patterned using lithography patterning processes, etching processes, other suitable processes, or combinations thereof.

Figure 4A:
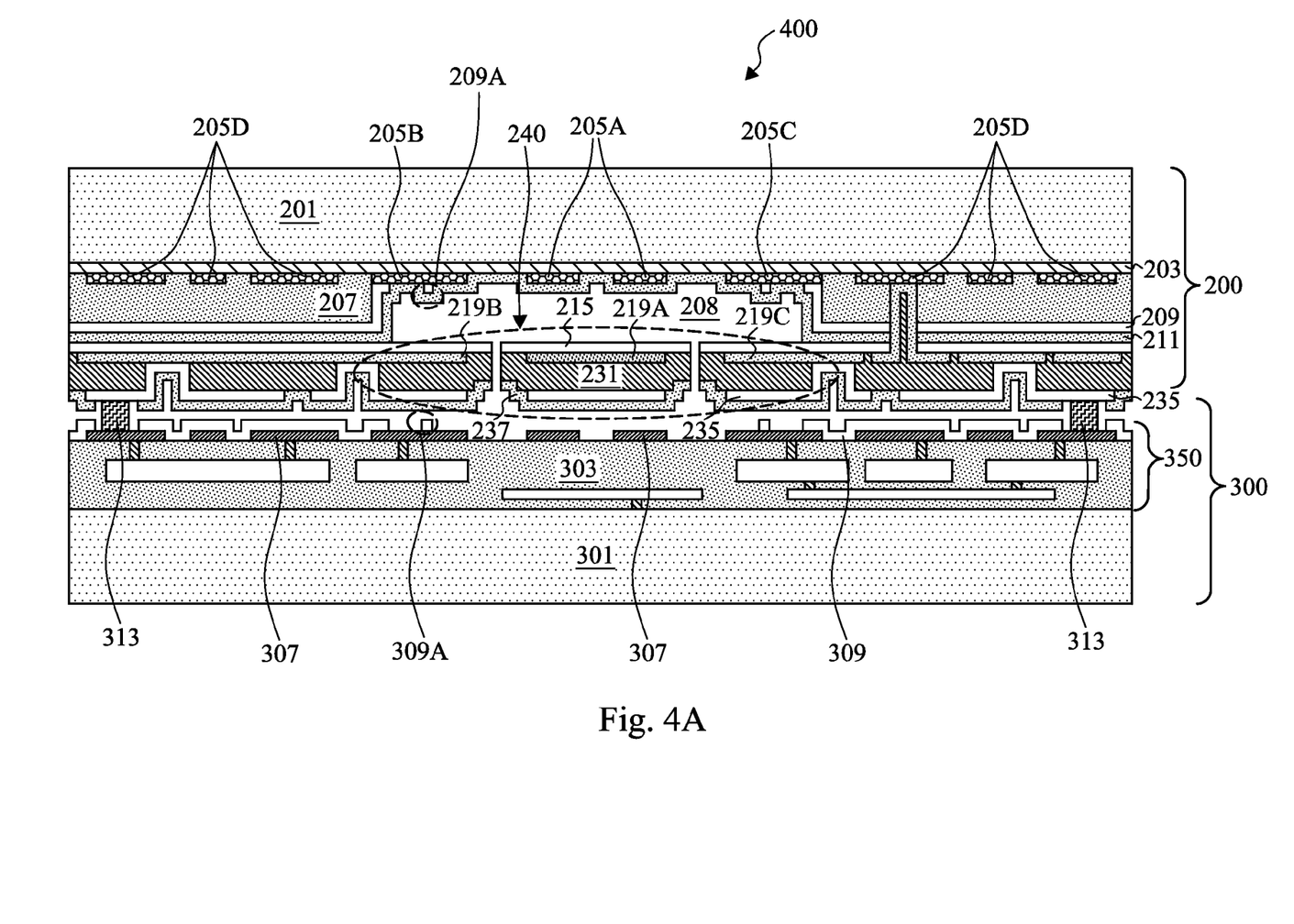
FIGS. 4A to 4B are cross-sectional views of a stacked semiconductor device including a MEMS device bonded to a CMOS device at various stages of manufacture according to at least one embodiment of this disclosure.
Figure 4B:
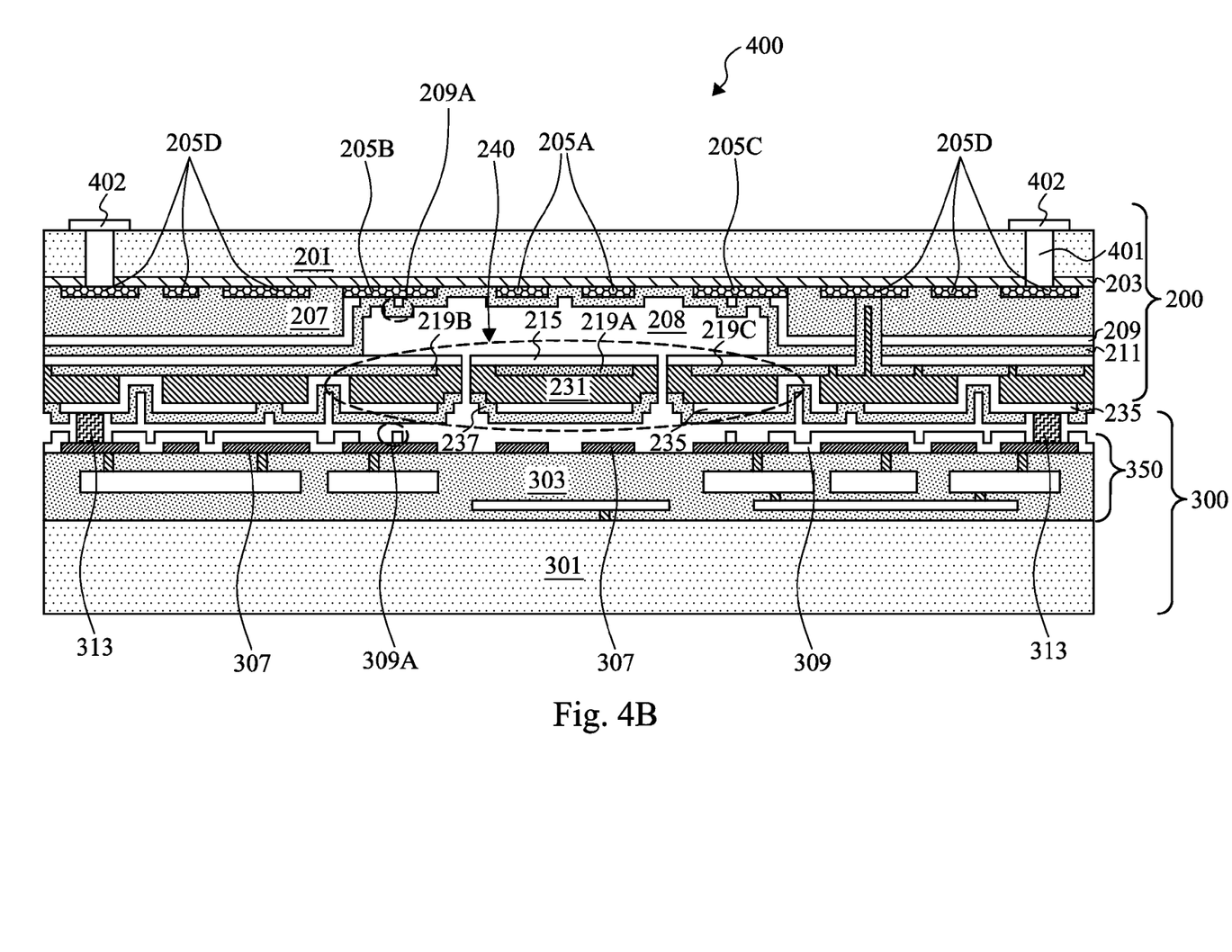

FIGS. 4A to 4B are cross-sectional views of a stacked semiconductor device 400 including the MEMS device 200 and the CMOS device 300 at various stages of manufacture according to one or more embodiments of this disclosure.

FIG. 4A is a cross-sectional view of the stacked semiconductor device 400 after performing operation 116. Referring to FIG. 4A, the MEMS device 200 is bonded to the CMOS device 300 to form the stacked semiconductor device 400. In the depicted embodiment, the bonding features 313 on the metal elements 307 of the CMOS device 300 are bonded to the metal layer 235 of the MEMS device 200 through the apertures 239B. The bonding features 313 electrically connect the MEMS device 200 and the CMOS device 300. Due to the bonding features 313 interposed between the MEMS device 200 and the CMOS device 300, the movable structure 240 is suspended over the front side of the CMOS device 300.

In certain examples, a eutectic bonding process is performed to bond the MEMS device 200 and the CMOS device 300. The eutectic bonding process is performed by heating two (or more) materials that are in contact such that the two (or more) materials diffuse together to form an alloy composition. Since the bonding features 313 include a metal material or a semiconductor material, the eutectic bonding process may form a metal/metal bonding (for example, Al/Al bonding) interface or a metal/semiconductor material bonding (for example, Al/Ge bonding) interface.

Referring to FIG. 4B, after bonding processes, the MEMS substrate 201 in the stacked semiconductor device 400 is thinned from a back surface opposite to the movable structure 240 of the MEMS substrate 201. In at least one embodiment, a planarization process, such as a chemical mechanical polishing (CMP) process, grinding, and/or chemical etching, is applied to the back surface of the MEMS substrate 201 to reduce a thickness of the MEMS substrate 201.

Still referring to FIG. 4B, after thinning processes, through substrate vias (TSVs) 401 are formed within substrate 201, extending from the back surface opposite to the movable structure 240 of the MEMS substrate 201 to portions of metal sections 205D. As such, TSVs 401 provide both internal and external electrical connections for the stacked semiconductor device 400. The stacked semiconductor device 400 may also include a metal pad 402 over the back surface of substrate 201 and connect to the TSV 401. The metal pad 402 may bond to a solder ball or a conductive bump to provide the external electrical connection to the metal sections 205A-D, the metal features 219A-C, and the metal layer 235 of the MEMS device 200. Furthermore, the metal pad 402 may provide the external electrical connection to CMOS device 300 through the TSV 401, the metal sections 205A-D, the metal features 219A-C, the metal layer 235, the bonding features 313, the metal elements 307 and the MLI 350. Accordingly, the stacked semiconductor device 400 has been integrated with the MEMS device 200 and the CMOS device 300, thereby providing a device to minimize and stabilize undesirable electrical parasitics at a low assembly cost. The first electrode and the second electrode in the MEMS device 200 construct a capacitor having a variable capacitance.

In some examples, through substrate holes are formed in the MEMS substrate 2011 using lithography patterning processes and etching processes to expose portions of the metal sections 205D. An insulation layer is formed on sidewalls of the through substrate holes and over the back surface MEMS substrate 201. The insulation layer includes silicon oxide, silicon nitride or silicon oxy-nitride. The through substrate holes are overfilled with a conductive material and the excess conductive material is removed, and then the conductive material is patterned to form TSVs 401 depending on design requirements of the MEMS device 200. The conductive material of the TSVs 401 includes aluminum, copper or aluminum/copper alloy. The formation methods of the conductive material include electroless plating, sputtering, printing, electro plating or CVD.

In an operation of the stacked semiconductor device 400 including at least one RF MEMS switch device 200 is described as following. When the movable structure 240 (including the flexible second electrode) is at "horizontal position", the capacitance between the second electrode in MEMS device 200 and the first electrode in the MEMS device 200 is "low". A RF signal transmitting in the metal sections 205A (signal element of the first electrode) goes all the way alone the metal sections 205A. The RF signal is in "on" state.

When a predetermined voltage is applied between the pull-down elements of the first electrode (metal sections 205B-C) and the pull-down elements of the second electrode (metal features 219B-C), the movable structure 240 (including the flexible second electrode) is pulled by an electrostatic force and collapses upward to the first electrode in "up position". The signal element of the second electrode (metal features 219A) is pushed upward until it conforms to the dielectric stop layer 211 over the signal element of the first electrode (metal sections 205A). The dielectric stop layer 211 and the second dielectric layer 215 prevent the first electrode and the second electrode from electrically shorted. The capacitance between the first electrode and the second electrode in the MEMS device 200 is "high". The RF signal transmitting in the signal element of the first electrode (metal sections 205A)

may shunt to the signal element of the second electrode (metal features 219A). The RF signal may not go all the way alone the metal sections 205A. The RF signal goes from the metal sections 205A in the first electrode to the metal features 219A in the second electrode. The RF signal is in "off" state. The movable second electrode in the MEMS device 200 is variable as a switch to control the transmission of the RF signal.

The insulating bumps 209A may provide a counterforce on the second electrode in the MEMS device 200 to prevent the second electrode sticking on the first electrode if there is a residual electrostatic force between the first and second electrodes when the predetermined voltage is withdrawn.

One aspect of the disclosure describes a stacked semiconductor device. The stacked semiconductor device includes a complementary metal-oxide-semiconductor (CMOS) device and a micro-electro-mechanical system (MEMS) device. The CMOS device includes a first substrate having at least one transistor disposed over the first substrate. A multilayer interconnect is disposed over the at least one transistor and electrically coupled to the at least one transistor. Metal elements are disposed over the multilayer interconnect. The MEMS device includes a second substrate. Metal sections are over the second substrate. A first dielectric layer is disposed over the metal sections. The first dielectric layer has a thickness at least larger than 0.5 micrometer. A cavity is disposed in the first dielectric layer and exposing portions of the metal sections. The cavity has an interior surface. A dielectric stop layer is disposed at least over the interior surface of the cavity. A movable structure is disposed over a front surface of the first dielectric layer and suspending over the cavity. The movable structure includes a second dielectric layer over the front surface of the first dielectric layer and suspending over the cavity, metal features over the second dielectric layer, and a flexible dielectric membrane over the metal features. The CMOS device is bonded to the MEMS device with the metal elements toward the flexible dielectric membrane.

A further aspect of the disclosure describes a stacked semiconductor device. The stacked semiconductor device includes a CMOS device and a MEMS device. The CMOS device includes a first substrate having at least one transistor disposed over the first substrate. A multilayer interconnect is disposed over the at least one transistor and electrically coupled to the at least one transistor. Metal elements are disposed over the multilayer interconnect. The MEMS device includes a second substrate. A first electrode is over the second substrate. A first dielectric layer is disposed over the first electrode. The first dielectric layer has a thickness at least larger than 0.5 micrometer. A cavity is disposed in the first dielectric layer and exposing the first electrode. A movable structure is disposed over a front surface of the first dielectric layer and suspending over the cavity. The movable structure including a second dielectric layer over the front surface of the first dielectric layer and suspending over the cavity. A second electrode is over the second dielectric layer. A flexible dielectric membrane is over the second electrode. Bonding features are bonded between the CMOS device and the MEMS device to electrically connect the CMOS device and the MEMS device. The first electrode and the second electrode construct a capacitor having a variable capacitance.

The present disclosure also describes a method of forming a stacked semiconductor device. A first substrate having a front surface is provided. A plurality of metal sections is formed over the front surface of the first substrate. A first dielectric layer is formed over the front surface of the first substrate. The first dielectric layer has a cavity exposing portions of the metal sections. A dielectric stop layer is formed over the first dielectric layer, an interior surface of the cavity and exposed metal sections. The cavity is filled with a sacrificial material. A second dielectric layer is formed over the filled sacrificial material and portions of the dielectric stop layer. Metal features are formed over the second dielectric layer. A flexible dielectric membrane is formed over the metal features. The flexible dielectric membrane has a plurality of openings exposing portions of the metal features. A metal layer having discrete portions is formed over the flexible dielectric membrane. Parts of the discrete portions of the metal layer contact the exposed metal features through the openings. A cap dielectric layer is formed over the metal layer and the flexible dielectric membrane. Portions of the cap dielectric layer, the flexible dielectric membrane and the second dielectric layer are etched. Thereby through-holes are formed to expose portions of the filled sacrificial material. The filled sacrificial material is removed through the through-holes from the cavity. Thereby a movable structure is formed and suspended over the cavity. The movable structure includes the cap dielectric layer, the metal layer, the flexible dielectric membrane, the metal features and the second dielectric layer. A second substrate having at least one transistor is provided. A multilayer interconnect is formed over the at least one transistor and electrically coupled to the at least one transistor. Metal elements are formed over the multilayer interconnect. The metal elements are bonded to the metal layer of the first substrate through bonding features.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A stacked semiconductor device comprising:
   a complementary metal-oxide-semiconductor (CMOS) device, the CMOS device comprising:
      a first substrate having at least one transistor disposed over the first substrate;
      a multilayer interconnect disposed over the at least one transistor and electrically coupled to the at least one transistor; and
      metal elements disposed over the multilayer interconnect; and
   a micro-electro-mechanical system (MEMS) device, the MEMS device comprising:
      a second substrate;
      metal sections over the second substrate;
      a first dielectric layer disposed over the metal sections, the first dielectric layer having a thickness at least larger than 0.5 micrometer;
      a cavity disposed in the first dielectric layer and exposing portions of the metal sections, the cavity having an interior surface;
      a dielectric stop layer disposed at least over the interior surface of the cavity; and
      a movable structure disposed over a front surface of the first dielectric layer and suspending over the cavity, the movable structure including a second dielectric layer over the front surface of the first dielectric layer and suspending over the cavity, metal features over the second dielectric layer, and a flexible dielectric membrane over the metal features, wherein the CMOS device is bonded to the MEMS device with the metal elements.

2. The stacked semiconductor device of claim 1, wherein the movable structure further comprises a metal layer having discrete portions over the flexible dielectric membrane opposite to the metal features.

3. The stacked semiconductor device of claim 2, further comprising a cap dielectric layer over the metal layer having discrete portions.

4. The stacked semiconductor device of claim 2, further comprising bonding features bonded to metal elements of the CMOS device and the metal layer of the MEMS device.

5. The stacked semiconductor device of claim 1, wherein portions of the metal sections over the second substrate and portions of metal features of the movable structure construct a micro-machined capacitor with a variable capacitance.

6. The stacked semiconductor device of claim 1, wherein the flexible dielectric membrane has a thickness in a range from about 0.5 micrometer to about 5 micrometer.

7. The stacked semiconductor device of claim 1, further comprising:

through substrate vias (TSVs) penetrating the second substrate to electrically connect the metal sections.

8. The stacked semiconductor device of claim 1, wherein a ratio of a thickness of the flexible dielectric membrane to a thickness of the metal features is in a range from about 2 to about 7.

9. The stacked semiconductor device of claim 1, wherein a ratio of a thickness of the flexible dielectric membrane to a thickness of the second dielectric layer is in a range from about 5 to about 70.

10. A stacked semiconductor device comprising:
a complementary metal-oxide-semiconductor (CMOS) device, the CMOS device comprising:
  a first substrate having at least one transistor disposed over the first substrate;
  a multilayer interconnect disposed over the at least one transistor and electrically coupled to the at least one transistor; and
  metal elements disposed over the multilayer interconnect; and
a micro-electro-mechanical system (MEMS) device, the MEMS device comprising:
  a second substrate;
  a first electrode over the second substrate;
  a first dielectric layer disposed over the first electrode, the first dielectric layer having a thickness at least larger than 0.5 micrometer;
  a cavity disposed in the first dielectric layer and exposing the first electrode; and
  a movable structure disposed over a front surface of the first dielectric layer and suspending over the cavity, the movable structure including a second dielectric layer over the front surface of the first dielectric layer and suspending over the cavity, a second electrode over the second dielectric layer, and a flexible dielectric membrane over the second electrode; and
bonding features bonded between the CMOS device and the MEMS device to electrically connect the CMOS device and the MEMS device, wherein the first electrode and the second electrode construct a capacitor having a variable capacitance.

11. The stacked semiconductor device of claim 10 further comprising insulating bumps disposed over the first electrode and under the second electrode.

12. The stacked semiconductor device of claim 10 further comprising a dielectric stop layer disposed at least over an interior surface of the cavity.

13. The stacked semiconductor device of claim 10, wherein the movable structure further comprises a metal layer having discrete portions over the flexible dielectric membrane opposite to the second electrode.

14. The stacked semiconductor device of claim 10, wherein a ratio of a thickness of the flexible dielectric membrane to a thickness of the second electrode is in a range from about 2 to about 7.

15. The stacked semiconductor device of claim 10, wherein the second substrate has a resistance of at least 1000 ohms-cm.

16. A stacked semiconductor device comprising:
a first device, including
  first substrate having an integrated circuit formed thereon, the first substrate including a contact pad on a surface thereof;
a second device, including
  a second substrate,
  a first electrode on the second substrate,
  a first dielectric layer over the first electrode, the first dielectric layer having a thickness of from about 0.5 micrometer to about 2 micrometer,
  a cavity in the first dielectric layer, wherein the first electrode in on a floor of the cavity,
  a flexible membrane suspended over the cavity, the flexible membrane having a second dielectric layer and a second electrode on a major surface of the flexible membrane facing the first electrode, and
  a metal layer having a first portion overlying the flexible membrane on a second major surface of the flexible membrane facing away from the first electrode, and having a second portion offset from the flexible membrane; and
a bonding feature bonding the contact pad of the first device to the second portion of the metal layer of the second device.

17. The device of claim 16, further comprising:
A through substrate via (TSV) penetrating through the first substrate.

18. The device of claim 16, further comprising a dielectric stop layer lining an interior surface of the cavity.

19. The device of claim 16, wherein the flexible membrane comprises a material selected from the group consisting of silicon oxide, silicon nitride, and silicon oxy-nitride.

20. The device of claim 16, wherein the wherein the first electrode and the second electrode form electrodes of a variable capacitor.

* * * * *